TIME MODULATION CIRCUIT

Filed Dec. 31, 1956

INVENTORS
GARY J. HIMLER
OTTIE C. MITCHELL
BY Lewis T. Humphries
ATTORNEY

United States Patent Office 3,002,158

Patented Sept. 26, 1961

3,002,158

TIME MODULATION CIRCUIT

Ottie C. Mitchell, Whittier, and Gary J. Himler, Lakewood, Calif., assignors to North American Aviation, Inc.

Filed Dec. 31, 1956, Ser. No. 631,593

4 Claims. (Cl. 332—14)

This invention relates to relaxation oscillators and more particularly to a voltage controlled time modulation circuit whose output varies non-linearly with a linear input.

Accurate and simple time modulation circuits which are designed to indicate a time interval proportional to a control variable are in constant demand. Time modulated wave forms are utilized in many timing applications. A specific application ocurs in the field of radar where a linear sweep is required by the indicator sweep generator.

Circuits which generate a linear time wave form are well known. Such a circuit is the saw-tooth wave generator which is a form of relaxation oscillator or multivibrator which generates a triangular wave form whose voltage to time ratio is a linear function. Since the accuracy of the wave form depends upon the linearity of the variation of voltage with time, it is desirable to have a circuit of extremely accurate linearity. Linearities of one tenth of 1% are not uncommon. However, in order to increase the range in a radar indicator sweep generator the control voltage must also be increased. A different speed sweep generator providing the increased control voltage is required. A radar system is therefore required which has several speeds of sweeps to meet the various distance requirements of target tracking.

This invention contemplates a circuit which generates delayed electrical output pulses in response to tracking pulses producing a linear relation between control voltage and time for a predetermined time and a non-linear relation for a predetermined time thereafter. A triangular wave output is obtained by the use of a negative feed back circuit between the output and input circuit of a relaxation oscillator type circuit. The slope of the triangular wave of subsequent output signals from the oscillator is varied to produce variable time delay output pulses.

The invention herein described is one of simplicity and and versatility. The production of the triangular wave forms variable to provide a linear or non-linear ratio between control voltage and time is a decided advantage.

It is therefore an object of this invention to extend the maximum delay available from a sweep generator.

It is another object of this invention to extend the duration of a phantastron generated wave form with a given maximum control voltage.

It is still another object of this invention to extend the duration of a phantastron generated delay while maintaining linearity of at least a portion thereof.

It is a further object of this invention to provide an improved triangular wave form generator.

It is a still further object of this invention to provide a relaxation oscillator which generates a delay electrical output in response to a tracking input whose wave form is controlled in linearity.

It is a further object of this invention to provide a wave form generator with variable linearity.

It is another object of this invention to provide a circuit for generating a wave form whose width may be varied non-linearly.

Other objects of invention will become apparent from the following description taken in connection with the accompanying drawings, in which.

Figure 1:
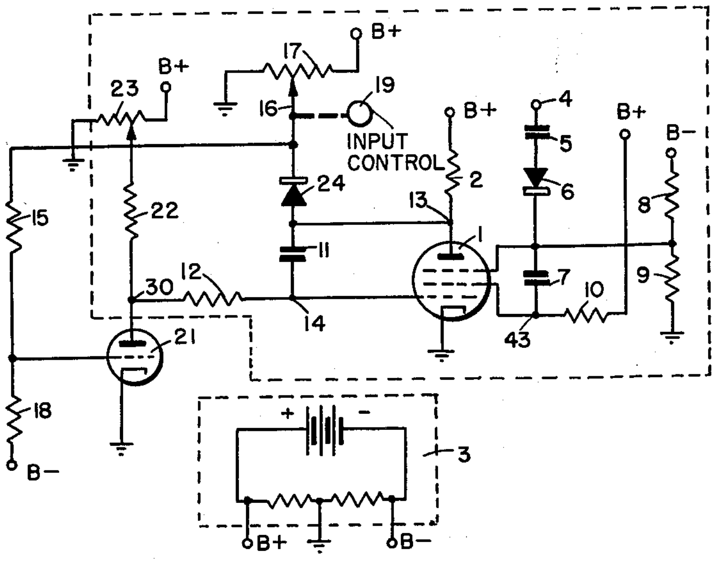
FIG. 1 is a schematic diagram of an illustrative embodiment of this invention.

Referring to FIG. 1, there is shown encompassed by the dotted line a relaxation oscillator commonly called a monostable screen-coupled phantastron. A similar phantastron circuit is shown on page 197 of the Radiation Laboratory Series, volume 19, published by McGraw-Hill. The phantastron comprises a pentode 1 which has its anode connected through resistor 2 to the B+ terminal of power supply 3 and its cathode connected to the ground terminal. The suppressor grid of pentode 1 is connected through resistor 8 to the B− terminal which provides a bias potential to keep pentode 1 normally nonconducting. Resistor 9, connecting the suppressor grid to ground, establishes the bias potential. The screen grid of pentode 1 is connected through resistor 10 to the B+ terminal to provide a current path for the cathode current when pentode 1 is nonconducting. Pentode 1 receives a positive triggering potential from input terminal 4 through capacitor 5 and trigger injecting diode 6 on its suppressor grid. The anode and control grid of pentode 1 are degeneratively coupled by a relaxation oscillator circuit comprising capacitor 11 and resistors 12 and 22 to establish a negative feedback type integrating circuit known as a Miller circuit. A potential level is established at point 13 in the anode circuit by control means 19, mechanically attached to wiper 16 of potentiometer 17 to vary the voltage presented by wiper 16 to the cathode of diode 24. The plate of diode 24 is connected to the anode of pentode 1 thereby clamping the voltage level at the anode to the voltage at wiper 16. Wiper 16 moves along potentiometer 17 which is connected between B+ and ground. Resistor 12 is connected through resistor 22 to the wiper of potentiometer 23 to establish a reference potential on the control grid of pentode 1. Potentiometer 23 is connected between B+ and ground. Point 13 in the anode circuit is connected to one plate of capacitor 11 and point 14 in the control grid circuit is connected in common to resistor 12 and the other plate of capacitor 11.

In operation of the circuitry within the dotted box of FIG. 1 pentode is initially nonconducting by reason of the negative bias at its suppressor grid. The potential at point 13 in the anode circuit is at B+. Current is flowing from the cathode through the screen grid and resistor 10 to the B+ terminal. A positive triggering potential applied to the suppressor grid through capacitor 5 and diode 6 causes current to flow from the cathode to the anode of pentode 1 and the anode potential at point 13 immediately falls. This drop in anode potential is coupled through capacitor 11 to the control grid causing the grid potential to fall which in turn causes the anode current to fall. At this point in the operation of the circuit, the anode potential is at a few volts below B+ and the grid potential is negative enough to prevent all but a small amount of current to flow from the cathode to the anode. It is here that the integrating action between the output and input of pentode 1 occurs. An electron current proportional to $$\frac{E\text{ ref }+E_s}{R}$$

where E ref is the potential at point 14, $E_s$ is the suppressor grid potential and R is the combined resistance of resistors 12 and 22, is flowing from the cathode to the anode through capacitor 11 and resistors 12 and 22 to the B+ terminal. The potential at point 13 falls relative to the potential at point 14 at a rate of $$\frac{E\text{ ref }+E_s}{RC}$$

volts per second where R is the resistance of resistors 12 and 22 and C is the capacitance of capacitor 11. It is thus readily apparent that the potential at point 13 in the anode circuit is falling linearly at a rate determined by capacitor 11, resistors 12 and 22, and the magnitude of the reference voltage established at point 14 from the wiper of potentiometer 23. The linear run-down at the anode continues until the anode potential reaches a level where, due to the charcteristics of pentode 1, further drop in potential at the anode is impossible. Current now ceases to flow from the cathode to the anode and instead flows through the screen grid and resistor 10 to the B+ terminal. The screen grid potential falls and this fall is coupled to the suppressor grid through capacitor 7 further cutting off the flow of current to the anode causing the anode potential to rise immediately to B+.

Until now, the operation of the circuit within the dotted line has been described and a linear run-down of anode potential at point 13 has been obtained through use of the Miller feedback circuit. The application of a positive trigger potential at terminal 4 starts the cycle which produces a triangular wave linear run-down of the anode potential at point 13. As explained above, the linearity and time of the run-down is dependent on the effect of capacitor 11 and resistors 12 and 22 in the coupling circuit between the anode and the control grid. In order to extend the run-down time of the potential at point 13 in the anode circuit the present invention incorporates a circuit which varies the reference voltage in accordance with a continuously variable control signal. The added circuit comprises triode 21 which has its anode connected to the junction of resistors 12 and 22 and its cathode connected to ground. The grid of triode 21 is connected through resistor 15 to wiper 16 of potentiometer 17. Resistor 18, connecting the grid of triode 21 to the B− terminal establishes the bias potential of the triode. Control means 19, mechanically attached to arm 16, varies the voltage presented to the grid of triode 21 through resistor 15 according to the mechanical output of the control means 19. The mechanical output may be derived either manually or from a control signal which may be, for example, a function of a linearly varying signal such as is received from an altimeter which is measuring pressure where the signal is a function of pressure and altitude. With a continuous movement of wiper 16, a continuously variable voltage is presented to the grid of triode 21 and to the anode of pentode 1 through clamping diode 24. Normally nonconducting triode 21 will conduct when the voltage presented to its grid through resistors 18 and 15, and potentiometer 17, rises to a predetermined level.

As noted previously, the rate at which the potential at point 13 falls during operation of the phantastron circuit is determined by the time constant produced by capacitor 11, resistors 12 and 22 and the magnitude of the reference potential. With predetermined fixed values for capacitor 11 and resistors 12 and 22 and the reference potential at the wiper of potentiometer 23, a linear wave form may be produced at point 13 upon application of a trigger pulse to the phantastron circuit. With triode 21 nonconducting the potential at point 13 is falling linearly at a rate directly proportional to $E$ ref/$RC$. When the grid bias voltage of triode 21 is sufficiently increased by control means 19, triode 21 commences conduction. The effective potential at point 30, the anode of triode 21, is then decreasing as a function of conduction current of triode 21 which in turn is increasing in proportion to the signal from control means 19. As the grid potential on triode 21 increases, current flowing in triode 21 increases and the potential at point 30 decreases as does the potential at point 14. Since the potential at point 13 is falling relative to point 14, the conduction of triode 21 varies the rate of change of potential at point 13 which may comprise the output terminal of the phantastron circuit. It is noted that a change in potential at point 14 varies the effect of the Miller circuit comprising capacitor 11 and resistors 12 and 22. Other points in the phantastron circuit may also be utilized as outputs. For example, if a square wave is desired point 43 of the screen grid circuit may be used as the output terminal.

Figure 2:
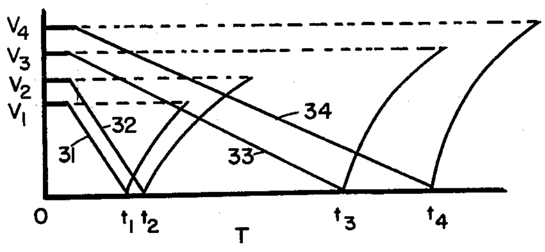
FIG. 2 is a graphical illustration of the output wave forms of the device of this invention.
Figure 3:
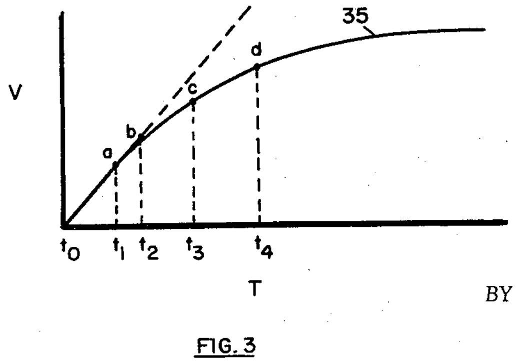
FIG. 3 illustrates the relationship between the control voltage and time delay of successive outputs.

Referring now to FIG. 2, wave forms at the output point 13 in the circuitry of FIG. 1 are shown for several different control voltages. Curve 31 represents the wave form at point 13 for a given control voltage $V_1$ at wiper 16. The time delay between the trigger pulse at input terminal 4 and an output pulse which is taken from point 13 when the potential falls to a predetermined point, as for example the zero voltage in FIG. 2, is indicated at $t_1$. Curve 32 shows a wave form which is produced when the control voltage is increased to $V_2$. In both wave forms 31 and 32 the control voltage is not of sufficient magnitude to cause conduction in triode 21. It is noted that the slope of the rundown portion of curves 31 and 32 is the same and the voltage increment from $V_1$ to $V_2$ is proportional to the time interval from $t_1$ to $t_2$. Stopping here in FIG. 2 and turning to FIG. 3 curve 35 indicates the relation between the control voltage determined by control means 19 and the time at which the potential at point 13 runs down to a predetermined value for the output curves 31 and 32. Point A on curve 35 denotes the time $t_1$ at which curve 31 of FIG. 2 reaches the predetermined zero level. Point B denotes the time $t_2$ at which curve 32 of FIG. 2 reaches the perdetermined zero level. It can be seen that curve 35 of FIG. 3 is linear between points A and B. This means that the increase in time delay between the trigger pulse input and the reaching of the predetermined zero level of the potential at point 13 for different control voltages is linear in the absence of conduction of triode 21 as shown by curve 35. In other words an increment of control voltage increase produces a directly proportional increment of time delay increase. Therefore, the relation between the control voltage and the time delay of the phantastron circuit output pulses is linear. The time delay is varying directly with the control voltage.

Turning back to FIG. 2 curve 33 is a wave form of the potential at output point 13 for an increased voltage $V_3$ produced by control means 19. The increased voltage $V_3$ is now sufficient to cause conduction in triode 21 which in turn decreases the available potential to the RC circuit of pentode 1 thereby decreasing the falling rate of potential at point 13. Or, in other words, the effective reference voltage at point 14 is decreasing with the increase in control voltage. The effect of the conduction in triode 21 is an increase in time delay of the circuit which is greater than the previous increase between wave forms 31 and 32. The voltage increment $V_1$–$V_2$ is equal to the increment $V_2$–$V_3$ but the time increment $t_1$–$t_2$ is much less than the time increment $t_2$–$t_3$. The time $t_2$–$t_3$ is much greater than would be expected from the previous time $t_1$ and $t_2$. In FIG. 3 point C on curve 35 denotes the time $t_3$ at which curve 33 reaches the predetermined zero level. It is thus readily apparent that curve 35 has now become non-linear. This means that the same increment of control voltage increase now produces a much greater increment of time delay increase. Wave form 34 of FIG. 2 shows further the increase in time delay at $t_4$ produced by the increment of voltage increase $V_4$ in control voltage. Point D of FIG. 3 on curve 35 indicating time $t_4$ indicates the non-linear increase in time delay for a linear increase in control voltage. In effect, then, the control voltage produced by control means 19 varies the time of rundown of anode potential at point 13 through diode 24 and varies the rate of rundown of potential at point 13 for successive trigger pulses by varying the reference potential at point 14 with triode 21 conducting. Thus, in FIG. 3, the time delay of successive operations in the phantastron circuit varies linearly with the control voltage when triode 21 is nonconducting and varies non-linearly with the control voltage when triode 21 is conducting. It is thus clear that the delay in rundown of voltage at point 13 produced by normal phantastron operation between points A and B can be extended substantially with a given control voltage by conduction of triode 21. A further extension of the delay in rundown of potential may be obtained by altering a few component values well known in the art.

The invention described above is useful in any voltage controlled time-modulation circuit. It has particular application to automatic range tracking systems in radar where a linear slope is required for a certain time, but where a non-linear slope may be tolerated for long range displays. Other applications utilizing the non-linear relationship between control voltage and time delay of the phantastron will occur wherever it is desirable to convert a signal which is varying linearly with time to a signal varying non-linearly with time. For example, in an altimeter in which pressure is varying with altitude in a non-linear relation, control means 19 of FIG. 1 connected to receive the output of the altimeter presents a non-linearly varying voltage to the phantastron circuit and output terminal 13 presents a linearly varying voltage when the non-linearity of the circuit time delay is adjusted to compensate for the non-linearity of the altimeter output.

Although the invention has been described and illustrated in detail, it is to be clearly understood that the same is by way of illustration and example only and is not to be taken by way of limitation, the spirit and scope of this invention being limited only by the terms of the appended claims.

We claim:

1. In combination an electronic valve having at least an input, a control, and an output electrode, means for establishing operating potentials on said valve according to an electrical signal representing a function of a continuously variable input control signal, triggering means connected to said input electrode for causing said valve to conduct, feedback means connected between said output and control electrodes of said valve to tend to cause said valve to nonconduct and control means for varying the effect of said feedback means according to said electrical signal.

2. The combination recited in claim 1 wherein said control means comprise a second electron valve having its output connected to said feedback means and its input adapted to receive said electrical signal representing a predetermined function of said input control signal.

3. A variable wave form generator comprising a normally nonconductive electron discharge tube having in successive dispositions a cathode, a first control grid, a screen grid, a second control grid and an anode, means connected to said anode and cathode for establishing operating potentials on said tube according to an electrical signal representing a function of a continuously variable input control signal, biasing means connected to said second control grid to prevent conduction of said tube, means coupled to said second control grid for applying an electrical triggering pulse to said tube for rendering said tube conductive, positive feedback means including a capacitor coupling said second control grid to said screen grid to aid said triggering means, negative feedback means including a resistance-capacitance timing circuit connecting said anode and said first control grid for decreasing the output of said tube, and variable impedance means coupled to said resistance-capacitance circuit to vary the resistance of said negative feedback means as a function of said continuously variable input control signal.

4. The combination recited in claim 3 wherein said variable impedance means comprises a second electron discharge tube having at least a cathode, a grid and an anode, the anode-cathode circuit providing a current path between said resistance capacitance circuit and said operating potential means, and control means connected to said last mentioned grid to cause said second tube to conduct at a predetermined time.

References Cited in the file of this patent

UNITED STATES PATENTS

| | | |
|---|---|---|
| 2,552,949 | Fleming-Williams | May 15, 1951 |
| 2,584,882 | Johnson | Feb. 5, 1952 |
| 2,627,025 | Trembly | Jan. 27, 1953 |
| 2,662,197 | Comte | Dec. 8, 1953 |
| 2,734,135 | Wagner | Feb. 7, 1956 |
| 2,814,760 | Beveridge et al. | Nov. 26, 1957 |
| 2,846,577 | Blasingame | Aug. 5, 1958 |
| 2,870,411 | Wagner | Jan. 20, 1959 |

FOREIGN PATENTS

| | | |
|---|---|---|
| 654,618 | Great Britain | June 20, 1951 |
| 144,067 | Australia | Nov. 2, 1951 |

OTHER REFERENCES

"Nonlinear Time-Delay Generator Uses Diodes," by Kaufman, Electronics, November 1955; pp.194, 196, 198, 200, 202.